(12) United States Patent
Jeon et al.

(10) Patent No.: US 12,527,015 B2
(45) Date of Patent: Jan. 13, 2026

(54) SEMICONDUCTOR DEVICE

(71) Applicant: SAMSUNG ELECTRONICS CO., LTD., Suwon-si (KR)

(72) Inventors: Intak Jeon, Suwon-si (KR); Hanjin Lim, Suwon-si (KR); Hyungsuk Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 450 days.

(21) Appl. No.: 18/095,561

(22) Filed: Jan. 11, 2023

(65) Prior Publication Data

US 2023/0387191 A1 Nov. 30, 2023

(30) Foreign Application Priority Data

May 26, 2022 (KR) .......................... 10-2022-0064505

(51) Int. Cl.
*H10D 1/68* (2025.01)
*H10B 12/00* (2023.01)

(52) U.S. Cl.
CPC ........... *H10D 1/696* (2025.01); *H10B 12/033* (2023.02); *H10B 12/315* (2023.02);
(Continued)

(58) Field of Classification Search
CPC ........ H10D 1/696; H10D 1/711; H10D 1/716; H10D 1/68; H10D 1/692; H10B 12/30;
(Continued)

(56) References Cited

U.S. PATENT DOCUMENTS

| 6,784,100 B2 * | 8/2004 | Oh ........................... H10D 1/68 257/296 |
| 9,142,558 B2 * | 9/2015 | Yang ...................... H10D 1/714 |

(Continued)

FOREIGN PATENT DOCUMENTS

| KR | 10-2003-0079424 A | 10/2003 |
| KR | 10-1901787 B1 | 9/2018 |

(Continued)

OTHER PUBLICATIONS

European Search Report, dated Oct. 10, 2023, issued by the European Patent Office for corresponding application EP 23163402.3.

*Primary Examiner* — Eduardo A Rodela
(74) *Attorney, Agent, or Firm* — Muir Patent Law, PLLC

(57) ABSTRACT

A semiconductor device includes a substrate, a plurality of lower electrodes disposed on the substrate, at least one support layer in contact with the plurality of lower electrodes and extending in a direction, parallel to an upper surface of the substrate, an upper electrode disposed on the plurality of lower electrodes and the at least one support layer, a dielectric layer between the plurality of lower electrodes and the upper electrode and between the at least one support layer and the upper electrode, and a blocking layer disposed between the at least one support layer and the dielectric layer, and including a material having a bandgap energy greater than a bandgap energy of a material of the at least one support layer. The dielectric layer is in contact with the plurality of lower electrodes and is spaced apart from the at least one support layer by the blocking layer.

19 Claims, 16 Drawing Sheets

(52) U.S. Cl.
CPC ......... *H10B 12/318* (2023.02); *H10B 12/482* (2023.02); *H10B 12/488* (2023.02); *H10D 1/68* (2025.01); *H10D 1/692* (2025.01)

(58) Field of Classification Search
CPC .... H10B 12/31; H10B 12/315; H10B 12/318; H10B 12/482; H10B 12/488; H10B 12/033
See application file for complete search history.

(56) References Cited

U.S. PATENT DOCUMENTS

| | | |
|---|---|---|
| 11,557,645 B2 * | 1/2023 | Tsai ................. H10D 1/042 |
| 2003/0190782 A1 | 10/2003 | Ko et al. |
| 2005/0087791 A1 | 4/2005 | Park et al. |
| 2013/0147048 A1 | 6/2013 | Kuh et al. |
| 2013/0249053 A1 | 9/2013 | Lee |
| 2014/0138794 A1 | 5/2014 | Yang et al. |
| 2016/0005806 A1 | 1/2016 | Yang et al. |
| 2019/0348417 A1 | 11/2019 | Yokoyama |
| 2021/0359082 A1 | 11/2021 | Kang et al. |
| 2022/0139922 A1 * | 5/2022 | Jhan ............... H10B 12/0335 257/296 |
| 2023/0030176 A1 * | 2/2023 | Lee ................. H10B 12/34 |
| 2024/0074150 A1 * | 2/2024 | Jeon ............... H10B 12/315 |
| 2024/0097002 A1 * | 3/2024 | Lin ............... H01L 21/31144 |

FOREIGN PATENT DOCUMENTS

| | | |
|---|---|---|
| KR | 10-1934037 B1 | 12/2018 |
| KR | 10-2021-0142345 A | 11/2021 |

* cited by examiner

SEMICONDUCTOR DEVICE

CROSS-REFERENCE TO RELATED APPLICATION

This application claims the benefit under 35 USC 119(a) of Korean Patent Application No. 10-2022-0064505, filed on May 26, 2022, in the Korean Intellectual Property Office, the entire disclosure of which is incorporated herein by reference for all purposes.

BACKGROUND

1. Field

Embodiments relate to a semiconductor device.

2. Description of the Related Art

In accordance with a demand for high integration and miniaturization of semiconductor devices, the size of the capacitor of the semiconductor device is also miniaturized. Accordingly, research into optimizing the structure of a capacitor capable of storing information in a dynamic random-access memory (DRAM) has been variously attempted.

SUMMARY

According to an example embodiment, a semiconductor device includes a substrate; a plurality of lower electrodes disposed on the substrate; at least one support layer in contact with the plurality of lower electrodes and extending in a direction, parallel to an upper surface of the substrate; an upper electrode disposed on the plurality of lower electrodes and the at least one support layer; a dielectric layer between the plurality of lower electrodes and the upper electrode and between the at least one support layer and the upper electrode; and a blocking layer disposed between the at least one support layer and the dielectric layer, and including a material having a bandgap energy greater than a bandgap energy of a material of the at least one support layer. The dielectric layer is in contact with the plurality of lower electrodes and is spaced apart from the at least one support layer by the blocking layer.

According to an example embodiment, a semiconductor device includes a plurality of contact structures on a substrate; an etch stop layer on the plurality of contact structures; a plurality of lower electrodes passing through the etch stop layer, and connected to the plurality of contact structures respectively; at least one support layer in contact with the plurality of lower electrodes and extending in a direction, parallel to an upper surface of the substrate; an upper electrode disposed on the plurality of lower electrodes and the at least one support layer; a dielectric layer between the plurality of lower electrodes and the upper electrode and between the at least one support layer and the upper electrode; a first blocking layer disposed between the at least one support layer and the dielectric layer, and including a material having a bandgap energy greater than a bandgap energy of a material of the at least one support layer; and a second blocking layer disposed between the etch stop layer and the dielectric layer, and including a material having a bandgap energy greater than a bandgap energy of a material of the at least one support layer.

According to an example embodiment, a semiconductor device includes a substrate; a plurality of lower electrodes disposed on the substrate, each of the plurality of lower electrodes including a conductive layer and an interfacial film extending along at least one surface of the conductive layer; at least one support layer in contact with a portion of a side surface of the conductive layer and extending in a direction, parallel to an upper surface of the substrate; an upper electrode disposed on the plurality of lower electrodes and the at least one support layer; a dielectric layer in contact with the interfacial film, and disposed between the interfacial film and the upper electrode and between the at least one support layer and the upper electrode; and a blocking layer disposed between the at least one support layer and the dielectric layer and in contact with the at least one support layer and the dielectric layer, the blocking layer including a material having a bandgap energy greater than a bandgap energy of a material of the at least one support layer.

According to an example embodiment, a method of manufacturing a semiconductor device includes forming lower electrodes and at least one support layer supporting the lower electrodes, on a substrate; forming a first blocking layer on a surface of the at least one support layer, using an Area Selective Atomic Layer Deposition process; forming a dielectric layer on the lower electrodes and the first blocking layer; and forming an upper electrode disposed on the dielectric layer.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
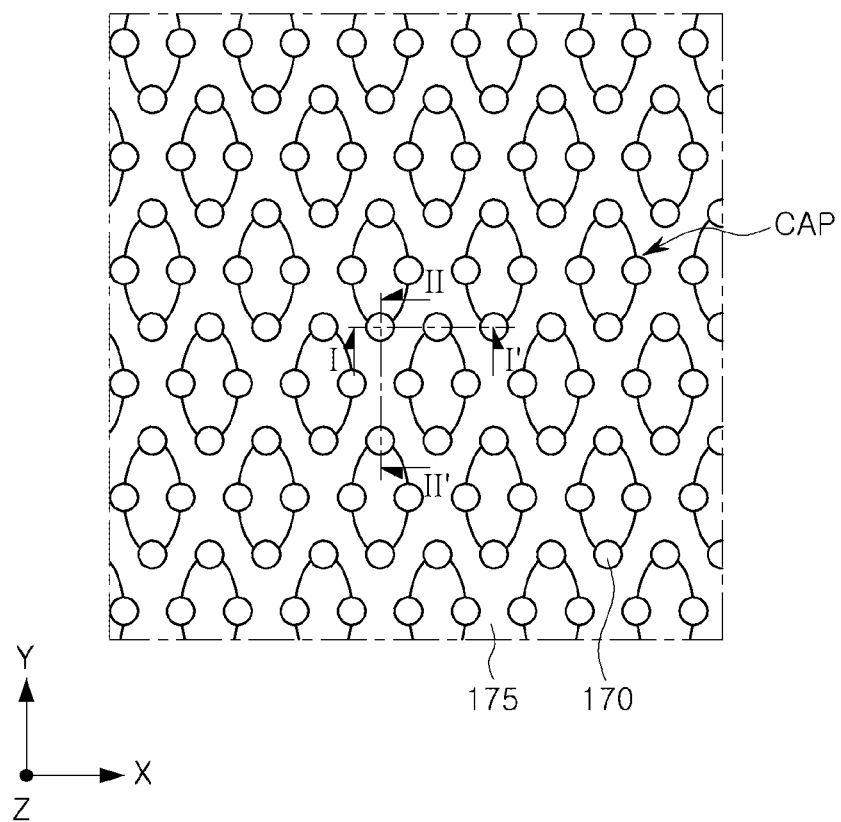
FIG. 1 is a schematic plan view of a semiconductor device according to example embodiments.
Figure 2:
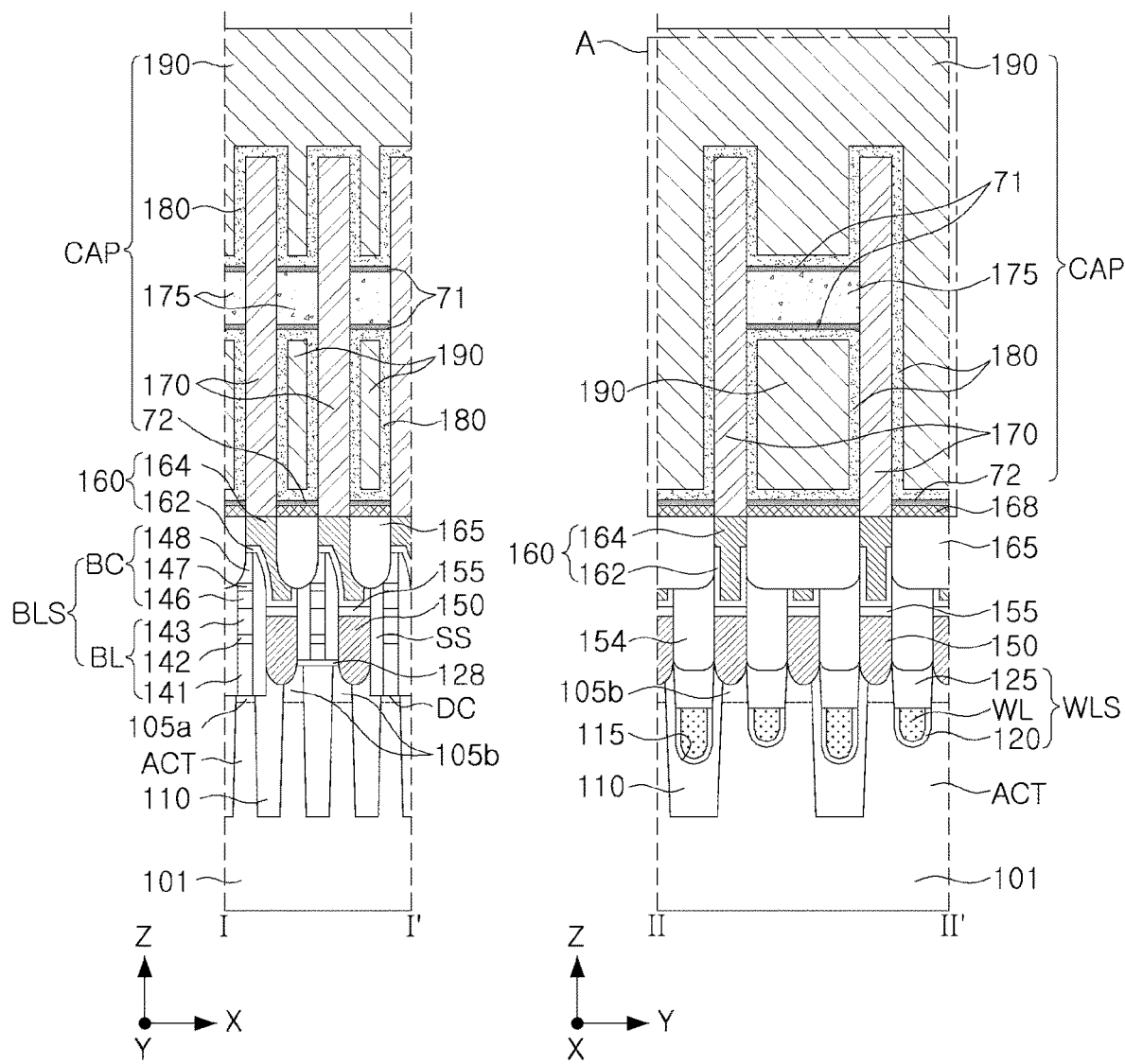
FIG. 2 is a schematic cross-sectional view of a semiconductor device according to example embodiments.
Figure 3:
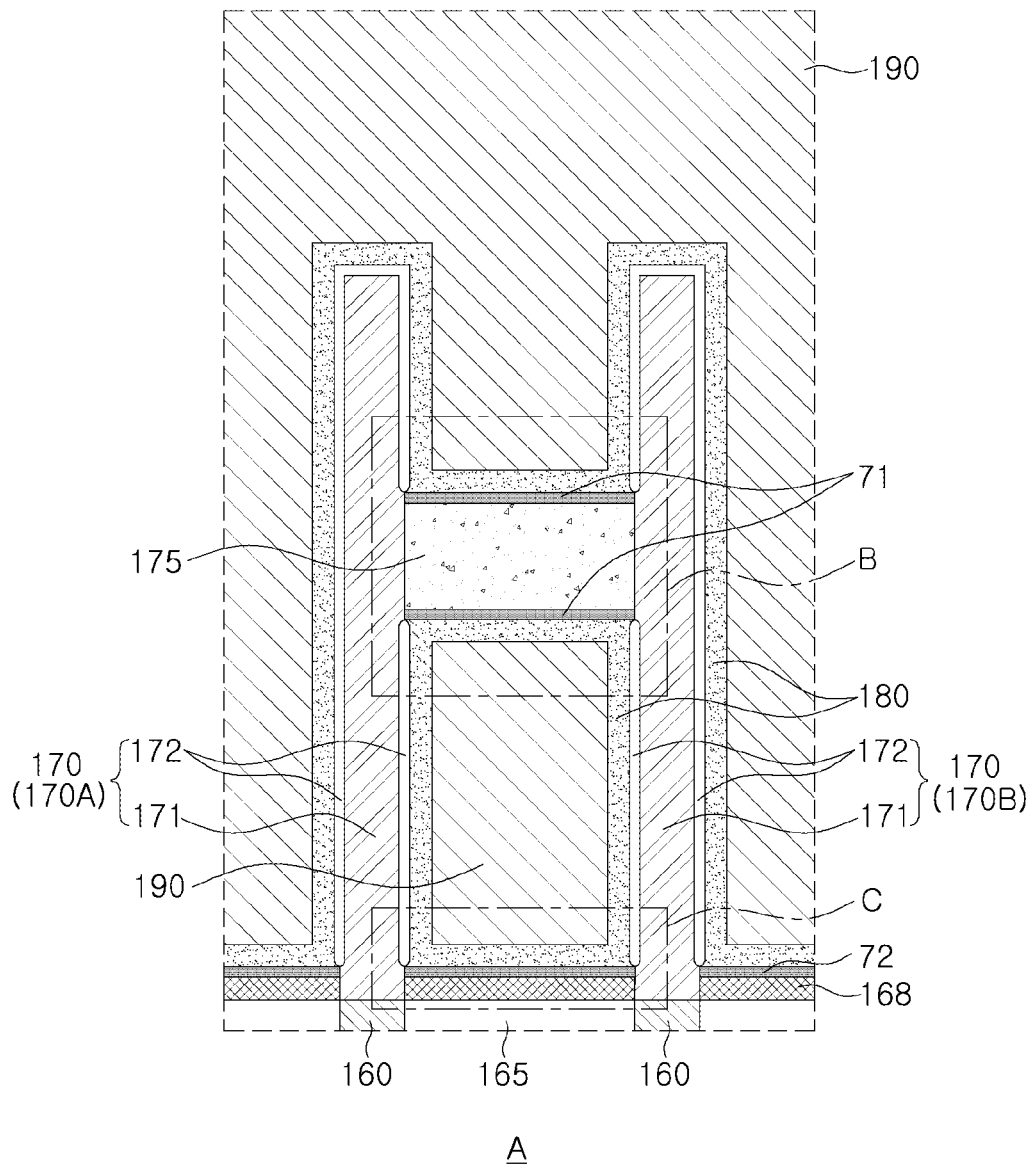
FIG. 3 is a partially enlarged cross-sectional view of area 'A' including a capacitor structure of a semiconductor device according to example embodiments.
Figure 4A:
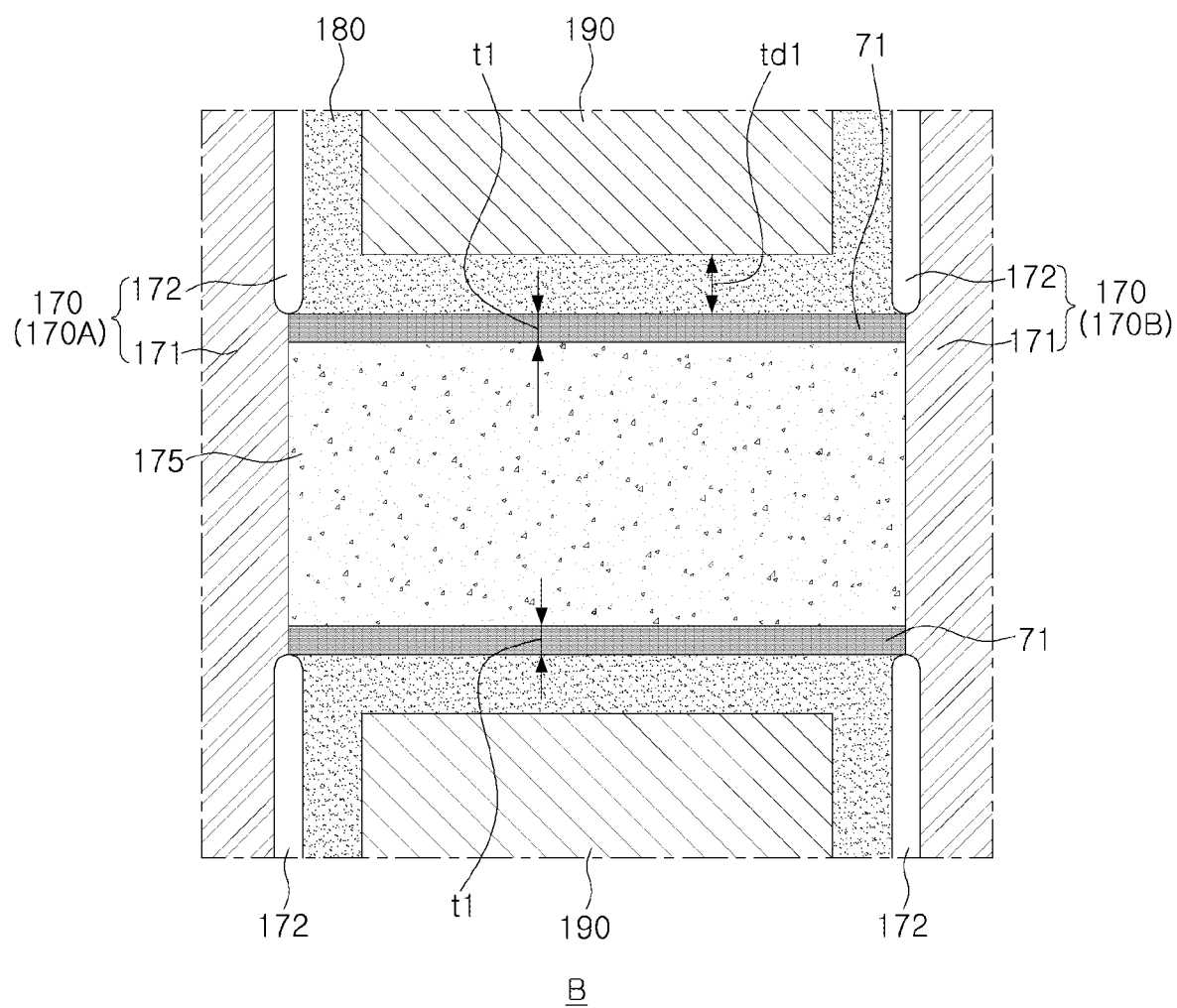
FIG. 4A is an enlarged view illustrating area 'B' of FIG. 3.
Figure 4B:
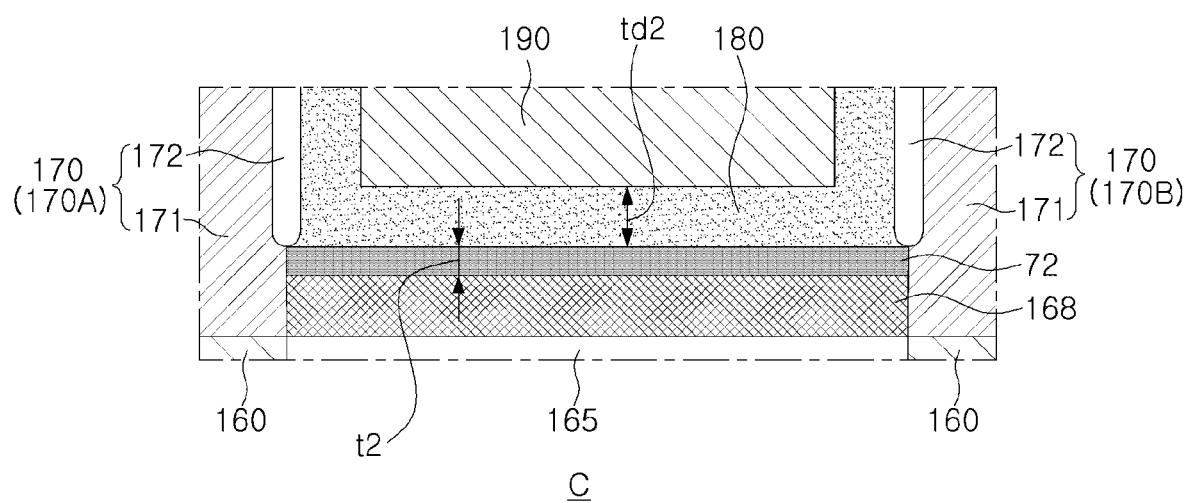
FIG. 4B is an enlarged view illustrating area 'C' of FIG. 3.

FIG. 1 is a schematic plan view of a semiconductor device according to example embodiments. FIG. 2 is a schematic cross-sectional view of a semiconductor device according to example embodiments. FIG. 2 illustrates cross-sections along lines I-I' and II-II' of FIG. 1. FIG. 3 is a partially enlarged cross-sectional view illustrating an enlarged area 'A' including a capacitor structure of a semiconductor device according to example embodiments. FIG. 4A is an enlarged view of area 'B' of FIG. 3, and FIG. 4B is an enlarged view of area 'C' of FIG. 3.

Referring to FIGS. 1 to 4B, a semiconductor device 100 may include a substrate 101 including active regions ACT, a device isolation layer 110 defining the active regions ACT in the substrate 101, a word line structure WLS buried and extending in the substrate 101 and including a word line WL, a bit line structure BLS extending while intersecting the word line structure WLS on the substrate 101 and including a bit line BL, contact structures 150, 155 and 160 on the side of the bit line structure BLS, and a capacitor structure CAP on the contact structures 150, 155 and 160. The semiconductor device 100 may further include an insulating pattern 165 and an etch stop layer 168.

The semiconductor device 100 may include, e.g., a cell array of a dynamic random access memory (DRAM). For example, the bit line BL may be connected to a first impurity region 105a of the active region ACT, and a second impurity region 105b of the active region ACT may be electrically connected to the capacitor structure CAP through the contact structures 150, 155, and 160. The capacitor structure CAP may include lower electrodes 170, an upper electrode 190 on the lower electrodes 170, a dielectric layer 180 between the lower electrodes 170 and the upper electrode 190, and a support layer 175 supporting the lower electrodes 170. To ensure node separation of the lower electrodes 170 and to prevent or significantly reduce leakage current, the capacitor structure CAP may further include a first blocking layer 71 disposed between the support layer 175 and the dielectric layer 180 and including a high bandgap energy material, and a second blocking layer 72 disposed between the etch stop layer 168 and the dielectric layer 180 and including a high bandgap energy material.

The semiconductor device 100 may include a cell array region in which the cell array is disposed, and a peripheral circuit region in which peripheral circuits for driving memory cells disposed in the cell array are disposed. The peripheral circuit region may be disposed around the cell array region.

The substrate 101 may include a semiconductor material, e.g., a group IV semiconductor, a group III-V compound semiconductor, or a group II-VI compound semiconductor. For example, the group IV semiconductor may include silicon, germanium, or silicon-germanium. The substrate 101 may further include impurities. The substrate 101 may be a silicon substrate, a silicon on insulator (SOI) substrate, a germanium substrate, a germanium on insulator (GOI) substrate, a silicon-germanium substrate, or a substrate including an epitaxial layer.

The active regions ACT may be defined in the substrate 101 by the device isolation layer 110. The active region ACT may have a bar shape, and may be disposed in an island shape extending in one direction within the substrate 101. The one direction may be a direction inclined with respect to the extension directions of the word lines WL and the bit lines BL. The active regions ACT may be arranged parallel to each other, such that an end of one active region ACT may be adjacent to a center of another active region ACT adjacent thereto.

The active region ACT may have the first and second impurity regions 105a and 105b having a predetermined depth from the upper surface of the substrate 101. The first and second impurity regions 105a and 105b may be spaced apart from each other. The first and second impurity regions 105a and 105b may be provided as source/drain regions of the transistor formed by the word line WL. The source region and the drain region may be formed by the first and second impurity regions 105a and 105b by doping or ion implantation of substantially the same impurities, and thus, may be referred to interchangeably, depending on the circuit configuration of the finally formed transistor. The impurities may include dopants having a conductivity type opposite to that of the substrate 101. In example embodiments, depths of the first and second impurity regions 105a and 105b in the source region and the drain region may be different from each other.

The device isolation layer 110 may be formed by a shallow trench isolation (STI) process. The device isolation layer 110 surrounds the active regions ACT and may electrically isolate the same from each other. The device isolation layer 110 may be formed of an insulating material, e.g., silicon oxide, silicon nitride, or combinations thereof. The device isolation layer 110 may include a plurality of regions having different depths of lower ends according to the width of the trench in which the substrate 101 is etched.

The word line structures WLS may be disposed in the gate trenches 115 extending in the substrate 101. Each of the word line structures WLS may include a gate dielectric layer 120, a word line WL, and a gate capping layer 125. In this specification, the gate may be referred to as a structure including the gate dielectric layer 120 and the word line WL, and the word line WL may be referred to as a 'gate electrode', and the word line structure WLS may be referred to as a 'gate structure'.

The word line WL may be disposed to cross the active area ACT and extend in the first direction X. For example, a pair of adjacent word lines WL may be disposed to traverse one active area ACT. The word line WL may constitute a gate of a buried channel array transistor (BCAT). In example embodiments, the word lines WL may have a shape disposed on the substrate 101. The word line WL may be disposed below the gate trench 115 to have a predetermined thickness. The upper surface of the word line WL may be positioned at a level lower than the upper surface of the substrate 101. In this specification, 'high' and 'low' with respect to the term "level", e.g., height that is relatively lower or higher, is defined relative to, e.g., based on, a substantially flat upper surface of the substrate 101.

The word line WL may include a conductive material, e.g., at least one of polycrystalline silicon (Si), titanium (Ti), titanium nitride (TiN), tantalum (Ta), tantalum nitride (TaN), tungsten (W), tungsten nitride (WN), and aluminum (Al). For example, the word line WL may include a lower pattern and an upper pattern formed of different materials, the lower pattern may include at least one of, e.g., tungsten (W), titanium (Ti), tantalum (Ta), tungsten nitride (WN), titanium nitride (TiN), and tantalum nitride (TaN), and the upper pattern may be a semiconductor pattern including, .g., polysilicon doped with P-type impurities or N-type impurities.

The gate dielectric layer 120 may be disposed on the bottom and inner surfaces of the gate trench 115. The gate dielectric layer 120 may conformally cover an inner wall of the gate trench 115. The gate dielectric layer 120 may include at least one of, e.g., silicon oxide, silicon nitride, and silicon oxynitride. The gate dielectric layer 120 may be, e.g., a silicon oxide film or an insulating film having a high dielectric constant. In example embodiments, the gate dielectric layer 120 may be a layer formed by oxidizing the active region ACT or a layer formed by deposition process.

The gate capping layer 125 may be disposed to fill the gate trench 115 on the word line WL. The upper surface of the gate capping layer 125 may be positioned at substantially the same level as the upper surface of the substrate 101. The gate capping layer 125 may be formed of an insulating material, e.g., silicon nitride.

The bit line structure BLS may extend in one direction, e.g., the second direction Y, perpendicular to the word line WL. The bit line structure BLS may include a bit line BL and a bit line capping pattern BC on the bit line BL.

The bit line BL may include a first conductive pattern 141, a second conductive pattern 142, and a third conductive pattern 143, which are sequentially stacked. The bit line capping pattern BC may be disposed on the third conductive pattern 143. A buffer insulating layer 128 may be disposed between the first conductive pattern 141 and the substrate 101, and a portion of the first conductive pattern 141 (hereinafter, a bit line contact pattern DC) may contact the first impurity region 105a of the active region ACT. The bit line BL may be electrically connected to the first impurity region 105a through the bit line contact pattern DC. The lower surface of the bit line contact pattern DC may be positioned at a level lower than the upper surface of the substrate 101, and may be positioned at a higher level than the upper surface of the word line WL. In an example embodiment, the bit line contact pattern DC may be formed in the substrate 101 to be locally disposed in the bit line contact hole exposing the first impurity region 105a.

The first conductive pattern 141 may include a semiconductor material, e.g., polycrystalline silicon. The first conductive pattern 141 may directly contact the first impurity region 105a. The second conductive pattern 142 may include a metal-semiconductor compound. The metal-semiconductor compound may be, e.g., a layer in which a portion of the first conductive pattern 141 is silicided. For example, the metal-semiconductor compound may include cobalt silicide (CoSi), titanium silicide (TiSi), nickel silicide (NiSi), tungsten silicide (WSi), or other metal silicides. The third conductive pattern 143 may include a metal material, e.g., titanium (Ti), tantalum (Ta), tungsten (W), and aluminum (Al). The number of conductive patterns forming the bit line BL, the type of material, and/or the stacking order may be variously changed according to example embodiments.

The bit line capping pattern BC may include a first capping pattern 146, a second capping pattern 147, and a third capping pattern 148 sequentially stacked on the third conductive pattern 143. Each of the first to third capping patterns 146, 147, and 148 may include an insulating material, e.g., a silicon nitride layer. The first to third capping patterns 146, 147, and 148 may be formed of different materials, and even when the first to third capping patterns 146, 147, and 148 include the same material, a boundary therebetween may be distinguished by a difference in physical properties. A thickness of the second capping pattern 147 may be less than a thickness of the first capping pattern 146 and a thickness of the third capping pattern 148, respectively. The number of capping patterns and/or the type of material constituting the bit line capping pattern BC may be variously changed according to example embodiments.

Spacer structures SS may be disposed on both sidewalls of each of the bit line structures BLS to extend in one direction, e.g., the Y direction. The spacer structures SS may be disposed between the bit line structure BLS and the lower conductive pattern 150. The spacer structures SS may be disposed to extend along sidewalls of the bit line BL and sidewalls of the bit line capping pattern BC. A pair of spacer structures SS disposed on both sides of one bit line structure BLS may have an asymmetric shape with respect to the bit line structure BLS. Each of the spacer structures SS may include a plurality of spacer layers, and may further include an air spacer according to example embodiments.

The lower conductive pattern 150 may be connected to one region of the active region ACT, e.g., the second impurity region 105b. The lower conductive pattern 150 may be disposed between the bit lines BL and between the word lines WL. The lower conductive pattern 150 may pass through the buffer insulating layer 128 to be connected to the second impurity region 105b of the active region ACT. The lower conductive pattern 150 may directly contact the second impurity region 105b. The lower surface of the lower conductive pattern 150 may be located at a level lower than the upper surface of the substrate 101, and may be located at a higher level than the lower surface of the bit line contact pattern DC. The lower conductive pattern 150 may be insulated from the bit line contact pattern DC by the spacer structure SS. The lower conductive pattern 150 may be formed of a conductive material, e.g., at least one of polycrystalline silicon (Si), titanium (Ti), titanium nitride (TiN), tantalum (Ta), tantalum nitride (TaN), tungsten (W), tungsten nitride (WN), and aluminum (Al). In an example embodiment, the lower conductive pattern 150 may include a plurality of layers.

A metal-semiconductor compound layer 155 may be disposed between the lower conductive pattern 150 and the upper conductive pattern 160. For example, when the lower conductive pattern 150 includes a semiconductor material, the metal-semiconductor compound layer 155 may be a layer in which a portion of the lower conductive pattern 150 is silicided. The metal-semiconductor compound layer 155 may include, e.g., cobalt silicide (CoSi), titanium silicide (TiSi), nickel silicide (NiSi), tungsten silicide (WSi), or other metal silicide. In some embodiments, the metal-semiconductor compound layer 155 may be omitted.

The upper conductive pattern 160 may be disposed on the lower conductive pattern 150. The upper conductive pattern 160 may extend between the spacer structures SS to cover the upper surface of the metal-semiconductor compound layer 155. The upper conductive pattern 160 may include a barrier layer 162 and a conductive layer 164. The barrier layer 162 may cover a lower surface and side surfaces of the conductive layer 164. The barrier layer 162 may include a metal nitride, e.g., at least one of titanium nitride (TiN), tantalum nitride (TaN), and tungsten nitride (WN). The conductive layer 164 may include a conductive material, e.g., at least one of polycrystalline silicon (Si), titanium (Ti), tantalum (Ta), tungsten (W), ruthenium (Ru), copper (Cu), molybdenum (Mo), Among platinum (Pt), nickel (Ni), cobalt (Co), aluminum (Al), titanium nitride (TiN), tantalum nitride (TaN), and tungsten nitride (WN).

The insulating patterns 165 may be disposed to penetrate the upper conductive pattern 160. A plurality of upper conductive patterns 160 may be separated by the insulating patterns 165. The insulating patterns 165 may include an insulating material, e.g., at least one of silicon oxide, silicon nitride, and silicon oxynitride.

The etch stop layer 168 may cover the insulating patterns 165 between the lower electrodes 170. The etch stop layer 168 may contact lower regions of side surfaces of the lower electrodes 170. The etch stop layer 168 may be disposed below the support layer 175. An upper surface of the etch stop layer 168 may be in contact with the second blocking layer 72, and may be spaced apart from the dielectric layer 180. The etch stop layer 168 may include, e.g., at least one of silicon nitride, silicon oxynitride, silicon carbonitride, and silicon boron nitride.

The capacitor structure CAP will be described in detail below with reference to FIGS. 3 to 4B.

The lower electrodes 170 may be disposed on the upper conductive patterns 160. The lower electrodes 170 may pass through the etch stop layer 168 to contact and be connected to the upper conductive patterns 160. The lower electrodes 170 may have a cylindrical shape or a hollow cylinder or cup shape. At least one support layer 175 supporting the lower electrodes 170 may be provided between the adjacent lower electrodes 170. Between the first electrode pattern 170A and the second electrode pattern 170B adjacent to each other among the lower electrodes 170, the support layer 175 in contact with the first electrode pattern 170A and the second electrode pattern 170B may be provided.

Each of the lower electrodes 170 may include a conductive layer 171 and an interfacial film 172 between the conductive layer 171 and the dielectric layer 180. The interfacial film 172 may extend vertically along the side surface of the conductive layer 171 from a region adjacent to the edge of the first blocking layer 71 to cover the upper surface of the conductive layer 171. The interfacial film 172 may extend vertically along a side surface of the conductive layer 171 from a region adjacent to the edge of the second blocking layer 72. For example, as illustrated in FIG. 3, the interfacial film 172 may extend continuously on surfaces of the conductive layer 171 that face the dielectric layer 180 to completely separate therebetween, e.g., so the interfacial film 172 may not extend on surfaces of the conductive layer 171 that do not directly face the dielectric layer 180. The conductive layer 171 may include at least one of, e.g., polycrystalline silicon (Si), titanium (Ti), titanium nitride (TiN), tantalum (Ta), tantalum nitride (TaN), tungsten (W), tungsten nitride (WN), and aluminum (Al). The interfacial film 172 may include at least one element among, e.g., tin (Sn), molybdenum (Mo), niobium (Nb), tantalum (Ta), titanium (Ti), indium (In), nickel (Ni), cobalt (Co), tungsten (W), ruthenium (Ru), zirconium (Zr), and hafnium (Hf), and at least one element of, e.g., oxygen (O) and nitrogen (N).

Figure 7:
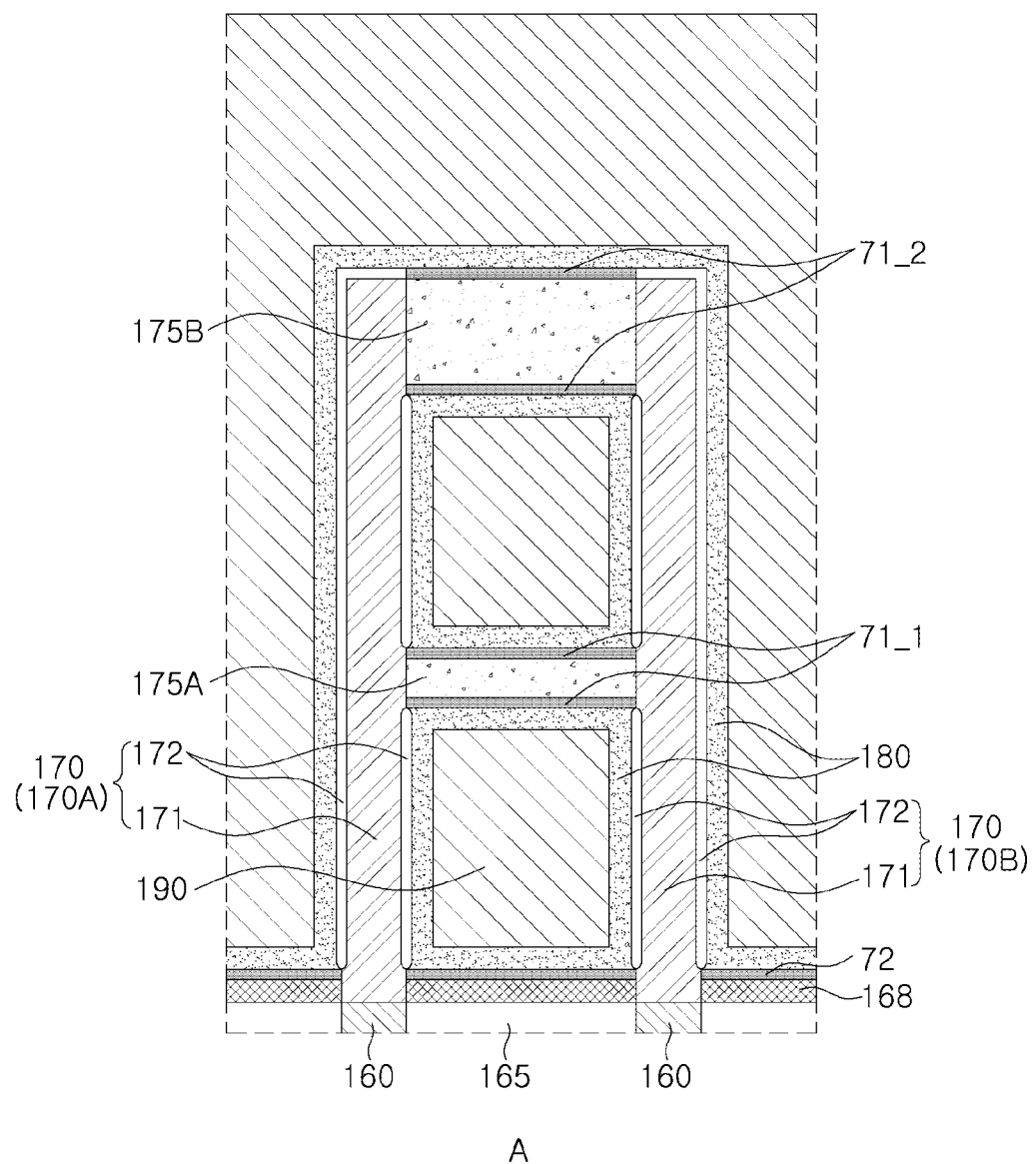
FIG. 7 is a partially enlarged cross-sectional view illustrating a region corresponding to area 'A' including a capacitor structure of a semiconductor device according to example embodiments.

The support layer 175 may, e.g., directly, contact the lower electrodes 170 and may extend in a direction parallel to the upper surface of the substrate 101. The support layer 175 may be a layer supporting the lower electrodes 170 having a high aspect ratio. The support layer 175 may have a shape in which some spaces between the lower electrodes 170 are opened in a plan view, as illustrated in FIG. 1, but the planar shape is not limited to the one illustrated and the shape may be variously changed according to example embodiments. The support layer 175 may be surrounded by the first blocking layer 71 on the upper surface, lower surface, and a portion of side surfaces, and may be spaced apart from the dielectric layer 180. The support layer 175 may include at least one of, e.g., silicon nitride, silicon oxynitride, silicon carbonitride, and silicon boron nitride. In an example embodiment, one support layer 175 may include a single layer or a plurality of layers. The number and thickness of the support layers 175 are not limited to the illustration, and may be variously changed according to example embodiments. For example, the support layer 175 may include two or more, plurality of support layers 175A and 175B as illustrated in FIG. 7.

The dielectric layer 180 may extend along the surfaces of the lower electrodes 170, the surface of the first blocking layer 71, and the surface of the second blocking layer 72. The dielectric layer 180 contacts the lower electrodes 170, e.g., through the interfacial film 172. The dielectric layer 180 may include a first portion extending along the lower surface of the first portion of the first blocking layer 71 (which extends along the lower surface of the support layer 175), and a second portion extending along the upper surface of the second portion of the first blocking layer 71 (which extends along the upper surface of the support layer 175). The dielectric layer 180 may be disposed between the lower electrodes 170 and the upper electrode 190. For example, the dielectric layer 180 may be disposed, e.g., directly, between the interfacial film 172 and the upper electrode 190. The dielectric layer 180 may be spaced apart from the support layer 175 by the first blocking layer 71. The dielectric layer 180 may include, e.g., a high dielectric material, or silicon oxide, silicon nitride, silicon oxynitride or combinations thereof. However, in some embodiments, the dielectric layer 180 may include, e.g., oxide, nitride, silicide, oxynitride, or silicified oxynitride containing one of, e.g., hafnium (Hf), aluminum (Al), zirconium (Zr), titanium (Ti), niobium (Nb), tantalum (Ta), yttrium (Y), and lanthanum (La).

The upper electrode 190 may be disposed on the dielectric layer 180. The upper electrode 190 may extend along the surface of the dielectric layer 180. The upper electrode 190 may be disposed on the lower electrodes 170 and the support layer 175. The upper electrode 190 may be disposed to cover the dielectric layer 180 between the lower electrodes 170 and to fill the space between the lower electrodes 170. The upper electrode 190 may include at least one of, e.g., polycrystalline silicon (Si), titanium (Ti), titanium nitride (TiN), tantalum (Ta), tantalum nitride (TaN), tungsten (W), tungsten nitride (WN), and aluminum (Al).

The first blocking layer 71 may be selectively deposited only on the surface of the support layer 175 and may not be deposited on the surface of the lower electrodes 170. For example, as illustrated in FIGS. 2-3, the first blocking layer 71 may be selectively deposited only on the upper and lower surfaces of the support layer 175 (i.e., on surfaces of the support layer 175 which are parallel to the upper surface of the substrate 101) and may not be deposited on lateral side surfaces of the support layer 175 (i.e., on surfaces of the support layer 175 which extend along a normal direction to the upper surface of the substrate 101).

For example, the first blocking layer 71 may be disposed, e.g., directly, between the support layer 175 and the dielectric layer 180 (e.g., in the vertical direction along the Z-axis) and may not be disposed between the lower electrodes 170 and the dielectric layer 180 (e.g., in a horizontal direction along the X-axis or the Y-axis). The first blocking layer 71 may be in contact with the support layer 175 and may extend along a surface of the support layer 175. For example, the first blocking layer 71 may include a first portion extending, e.g., lengthwise, along the lower surface of the support layer 175 and a second portion extending, e.g., lengthwise, along the upper surface of the support layer 175, e.g., the first blocking layer 71 may extend only along a horizontal direction parallel to the upper surface of the substrate 101. The first blocking layer 71 may not extend, e.g., lengthwise, along side surfaces of the lower electrodes 170. The first blocking layer 71 may be formed by an atomic layer deposition (ALD) process, and may be formed of a single layer or a plurality of layers.

As illustrated in FIG. 4A, The first blocking layer 71 may have a thickness t1 that is less than a thickness td1 of the dielectric layer 180 covering the first blocking layer 71. Although the thickness t1 of the first blocking layer 71 is illustrated to be the same as the thickness of the interfacial film 172, the thicknesses may be different from each other according to example embodiments. The thickness t1 of the first blocking layer 71 may be about 2 nm or less and about 0.2 nm or more. If the first blocking layer 71 is formed to have a thickness greater than the above range, e.g., greater than about 2 nm, the capacitance of the capacitor structure CAP may decrease, and if the first blocking layer 71 is formed to have a thickness less than the above, e.g., less than 0.2 nm, the effect of securing node separation or preventing leakage current may be insignificant.

In the absence of the first blocking layer 71, a conductive material layer or a residue of a conductive material would have been formed on the surface of the support layer 175 (during formation of the interfacial film 172 on the lower electrodes 170), thereby causing a leakage current between the lower electrodes 170 or an electrical connection path between the lower electrodes 170 to generate an electrical bridge. Therefore, according to the example embodiment, since the interfacial film 172 is formed on the lower electrodes 170 in a state in which the first blocking layer 71 is selectively formed on the surface of the support layer 175, the conductive material layer or a residue of the conductive material may be prevented from being formed on the surface of the support layer 175. A leakage current between the lower electrodes 170 may be prevented or substantially reduced, and an electrical bridge between the lower electrodes 170 may be prevented. Accordingly, a semiconductor device including the capacitor structure CAP having improved electrical characteristics and reliability may be provided.

The second blocking layer 72 may be selectively deposited only on the surface of the etch stop layer 168, and may not be disposed on the surface of the lower electrodes 170. For example, as illustrated in FIGS. 2-3, the second blocking layer 72 may be selectively deposited only on the upper surface of the etch stop layer 168 (i.e., on a surface of the etch stop layer 168 which is parallel to the upper surface of the substrate 101) and may not extend lengthwise along side surfaces of the lower electrodes 170 (i.e., may not extend on the lower electrodes 170 along a normal direction to the upper surface of the substrate 101).

For example, the second blocking layer 72 may be disposed between the etch stop layer 168 and the dielectric layer 180 (e.g., in the vertical direction along the Z-axis) and may not be disposed between the lower electrodes 170 and the dielectric layer 180 (e.g., in the horizontal direction along the X-axis or the Y-axis). The second blocking layer 72 is in, e.g., direct, contact with the etch stop layer 168 and may extend, e.g., lengthwise, along a surface of the etch stop layer 168. The second blocking layer 72 may not extend, e.g., lengthwise, along side surfaces of the lower electrodes 170. The second blocking layer 72 may be formed by an atomic layer deposition (ALD) process, and may be formed of a single layer or a plurality of layers. The second blocking layer 72 may be formed together in the same process operation as the first blocking layer 71.

As illustrated in FIG. 4B, the second blocking layer 72 may have a thickness t2 that is less than a thickness td2 of the dielectric layer 180 covering the second blocking layer 72. The thickness t2 of the second blocking layer 72 may be, e.g., about 2 nm or less and about 0.2 nm or more.

In the absence of the second blocking layer 72, a conductive material layer or a residue of the conductive material would have been formed on the surface of the etch stop layer 168 (during formation of the interfacial film 172 on the lower electrodes 170), thereby causing a leakage current between the lower electrodes 170 or an electrical connection path between the lower electrodes 170 to generate an electrical bridge. Therefore, according to the example embodiment, since the interfacial film 172 is formed on the lower electrodes 170 in a state in which the second blocking layer 72 is selectively formed on the surface of the etch stop layer 168, the conductive material layer or a residue of the conductive material may be prevented from being formed on the surface of the etch stop layer 168. A leakage current between the lower electrodes 170 may be prevented or substantially reduced, and an electrical bridge between the lower electrodes 170 may be prevented. Accordingly, a semiconductor device including the capacitor structure CAP having improved electrical characteristics and reliability may be provided.

The first and second blocking layers 71 and 72 may include a high bandgap energy material. For example, the first and second blocking layers 71 and 72 may include a material having a greater energy bandgap than a material forming the support layer 175. The first and second blocking layers 71 and 72 may independently and respectively include, e.g., aluminum oxide, zirconium oxide, lanthanum oxide, hafnium oxide, yttrium oxide, beryllium oxide, magnesium oxide, silicon oxide, hafnium silicon oxide, zirconium silicon oxide, or combinations thereof. For example, each of the first and second blocking layers 71 and 72 may include a material having a bandgap energy of about 5.0 eV or more. For example, each of the first and second blocking layers 71 and 72 may include a material having a bandgap energy of about 7.0 eV or more.

Figure 5A:
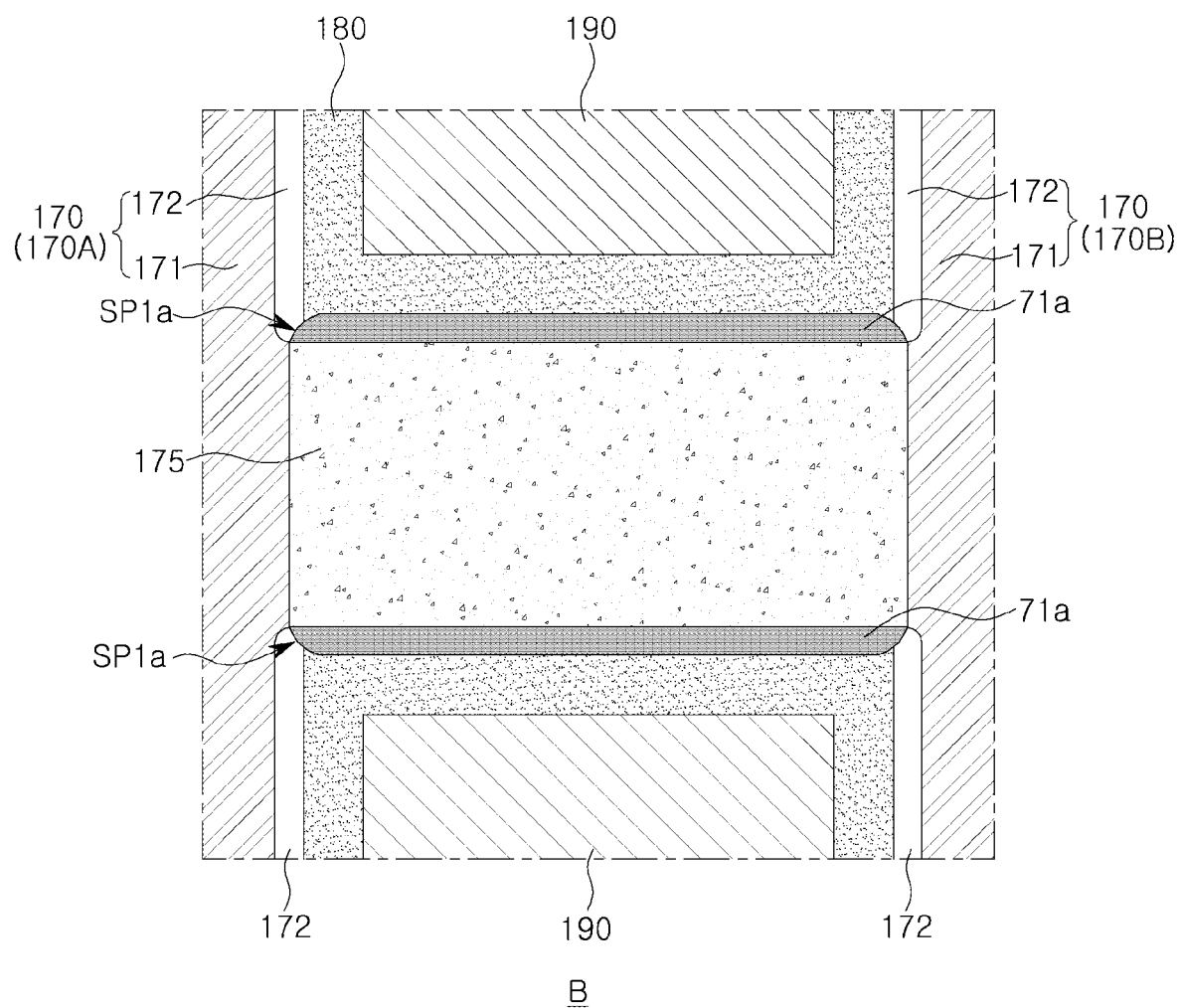
FIG. 5A is an enlarged view illustrating a region corresponding to area 'B' in FIG. 3.
Figure 5B:
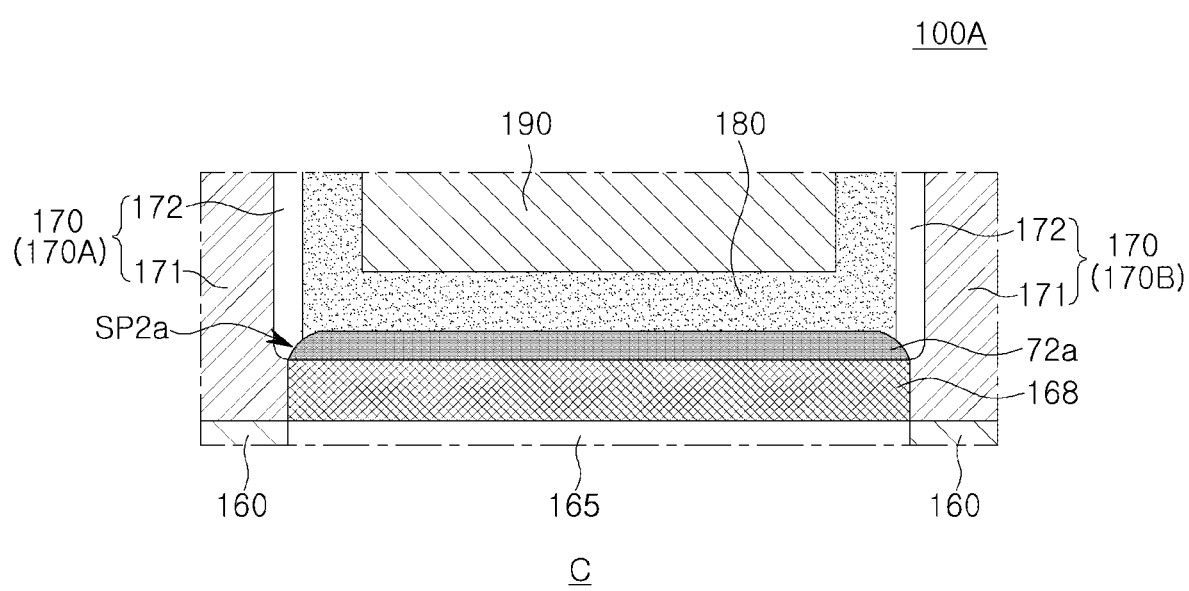
FIG. 5B is an enlarged view illustrating a region corresponding to area 'C' in FIG. 3.

FIG. 5A is an enlarged view illustrating a region corresponding to 'area 'B' in FIG. 3, and FIG. 5B is an enlarged view illustrating a region corresponding to 'area 'C' in FIG. 3.

Referring to FIGS. 5A and 5B, a first blocking layer 71a of a semiconductor device 100A may include at least one portion SP1a of which a thickness decreases as it approaches the side surfaces of the lower electrodes 170, and a second blocking layer 72a may include at least one portion SP2a of which a thickness decreases as it approaches the side surfaces of the lower electrodes 170. Side surfaces of the portions SP1a and SP2a may form an acute angle with the surface of the support layer 175 or the surface of the etch stop layer 168. Side surfaces of the portions SP1a and SP2a may include curved portions. As the first blocking layer 71a and the second blocking layer 72a include the portions SP1a and SP2a, respectively, the contact area between the lower electrodes 170 and the dielectric layer 180 may increase, and thus, the capacitance of the capacitor structure CAP may be improved.

Figure 6A:
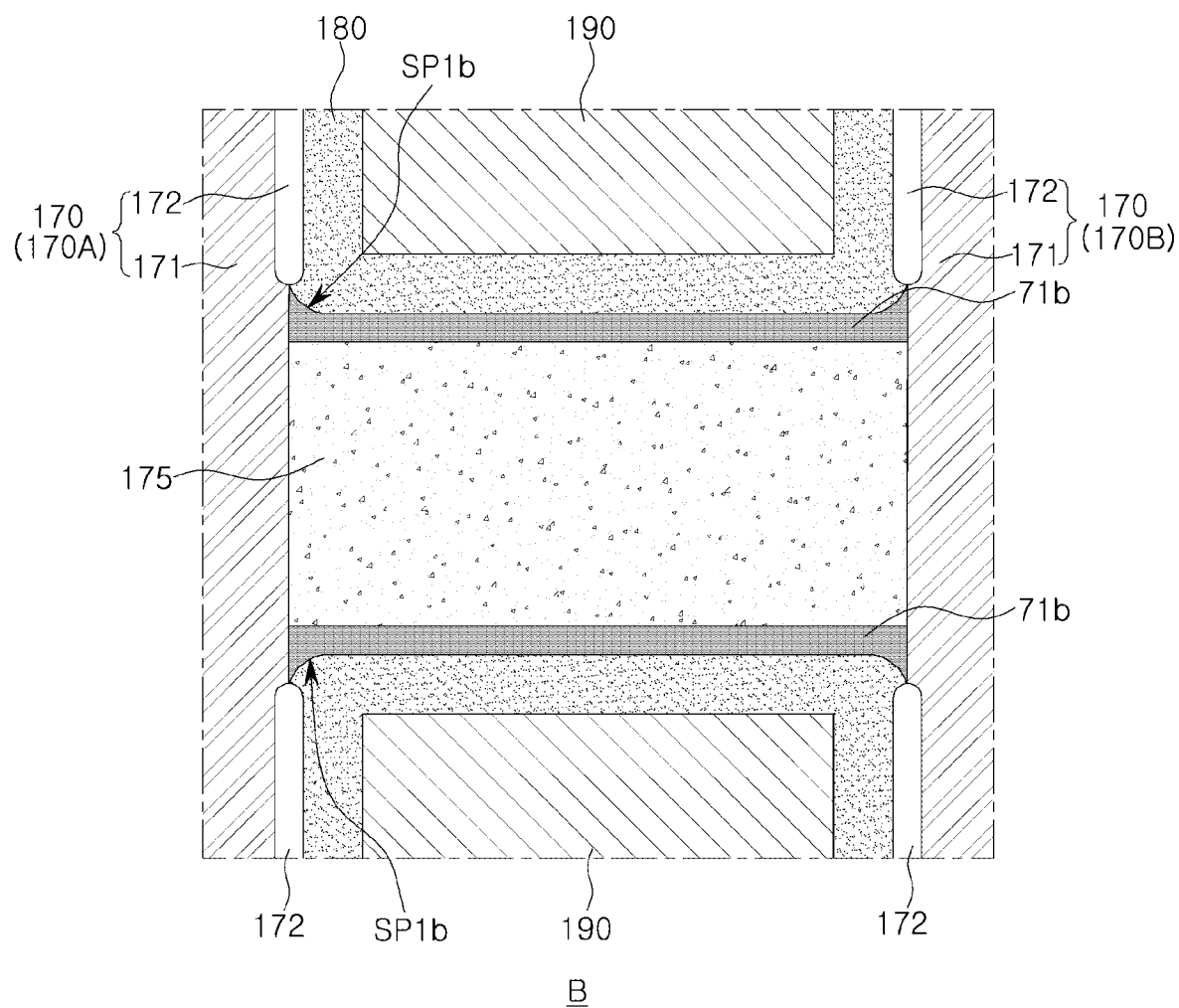
FIG. 6A is an enlarged view illustrating a region corresponding to 'area 'B' in FIG. 3.
Figure 6B:
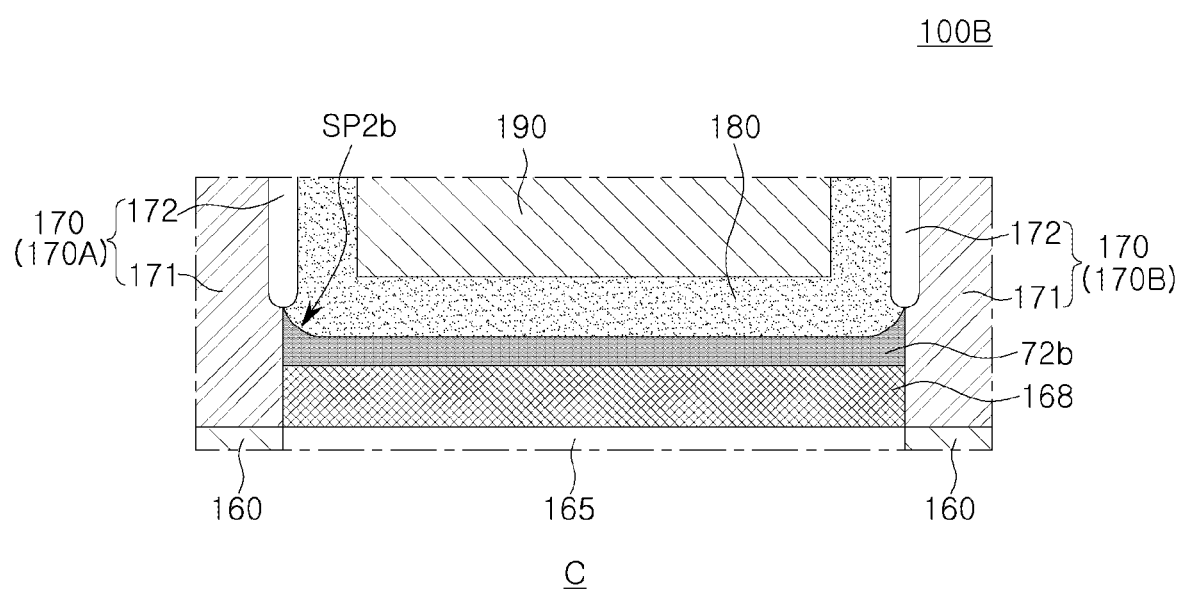
FIG. 6B is an enlarged view illustrating a region corresponding to area 'C' in FIG. 3.

FIG. 6A is an enlarged view illustrating a region corresponding to 'area 'B' in FIG. 3, and FIG. 6B is a diagram illustrating an enlarged region corresponding to 'area 'C' in FIG. 3.

Referring to FIGS. 6A and 6B, a first blocking layer 71b of a semiconductor device 100B may include at least one portion SP1b of which a thickness increases as it approaches the side surfaces of the lower electrodes 170, and a second blocking layer 72b may include at least one portion SP2b of which a thickness increases as it approaches the side surfaces of the lower electrodes 170. As the first blocking layer 71b and the second blocking layer 72b include the portions SP1b and SP2b, respectively, the occurrence of leakage current or electrical bridge between the lower electrodes 170 may be further prevented or significantly reduced.

FIG. 7 is a partially enlarged cross-sectional view illustrating an enlarged region corresponding to 'area 'A' in FIG. 2 including a capacitor structure of a semiconductor device according to example embodiments.

Referring to FIG. 7, a semiconductor device 100C may include at least two support layers 175A and 175B, first and second blocking layers 71_1 and 71_2 selectively deposited on the surfaces of the at least two support layers 175A and 175B, respectively, and a third blocking layer 72 selectively deposited on the surface of the etch stop layer 168. The at least two support layers 175A and 175B may include a first support layer 175A and a second support layer 175B on, e.g., above, the first support layer 175A. The second support layer 175B may have a thickness greater than that of the first support layer 175A. In other examples, the number of stacked support layers may be three or more, and blocking layers may be disposed on a surface of each support layer. In yet other examples, one or more of the first through third blocking layers 71_1, 71_2, and 72 may respectively include at least one portion having a different thickness as described with reference to FIGS. 5A to 6B.

Figure 8:
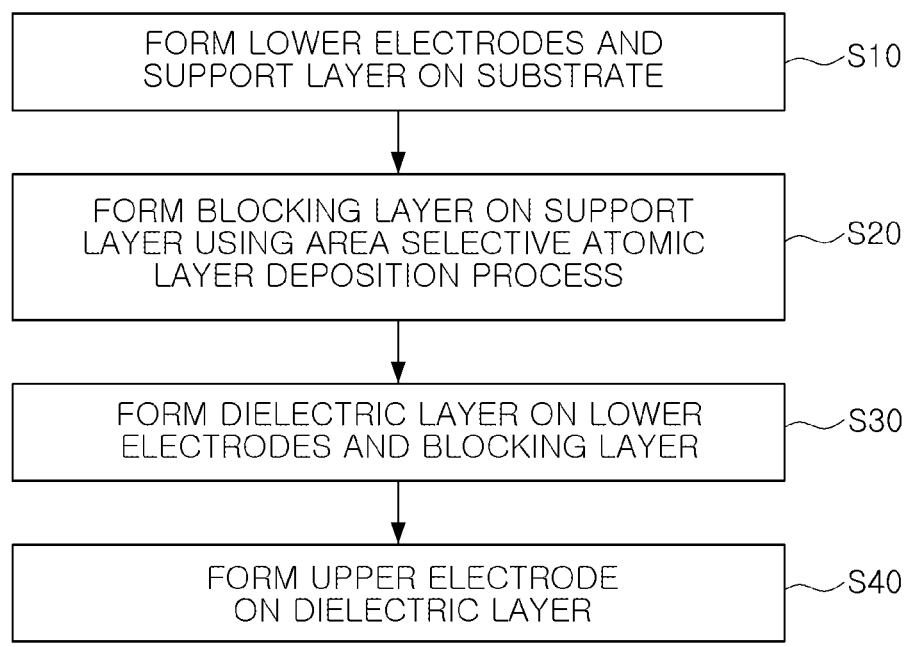
FIG. 8 is a flowchart illustrating a method of manufacturing a semiconductor device according to example embodiments.

FIG. 8 is a flowchart illustrating a method of manufacturing a semiconductor device according to example embodiments. FIGS. 9 to 13 are cross-sectional views of stages in a method of manufacturing a semiconductor device according to example embodiments. FIGS. 9 to 13 correspond to 'area 'A' of FIG. 2.

First, referring to FIG. 2, the active region ACT may be defined by forming the device isolation layer 110 on the substrate 101. A device isolation trench may be formed in the substrate 101, and the device isolation layer 110 may fill the device isolation trench. In a plan view, the active region ACT may have an elongated bar shape extending in a direction oblique to the extension direction of the word line WL. Impurity regions may be formed on the active region ACT by performing an ion implantation process using the device isolation layer 110 as an ion implantation mask. The active region ACT and the device isolation layer 110 may be patterned to form the gate trench 115. A pair of the gate trenches 115 may traverse the active region ACT. The impurity regions may also be separated by the gate trench 115 to form the first impurity region 105a and the second impurity region 105b.

The gate dielectric layer 120 may be formed on the inner surface of the gate trench 115 to have a substantially conformal thickness. Subsequently, the word line WL may be formed to fill at least a portion of the gate trench 115. The upper surface of the word line WL may be recessed to be lower than the upper surface of the active region ACT. The gate capping layer 125 may be formed on the word line WL by stacking an insulating layer on the substrate 101 to fill the gate trench 115 and by etching the same. An insulating layer and a conductive layer may be sequentially formed and patterned on the entire surface of the substrate 101 to form the buffer insulating layer 128 and the first conductive pattern 141 sequentially stacked. The buffer insulating layer 128 may be formed of at least one of, e.g., silicon oxide, silicon nitride, and silicon oxynitride. A plurality of buffer insulating layers 128 may be formed to be spaced apart from each other. The first conductive pattern 141 may have a shape corresponding to the planar shape of the buffer insulating layer 128. The buffer insulating layer 128 may be formed to simultaneously cover ends of two adjacent active regions ACT, e.g., adjacent second impurity regions 105b. Bit line contact holes may be formed by etching the upper portions of the device isolation layer 110, the substrate 101, and the gate capping layer 125 using the buffer insulating layer 128 and the first conductive pattern 141 as an etch mask. The bit line contact hole may expose the first impurity region 105a.

The bit line contact pattern DC may be formed to fill the bit line contact hole. Forming the bit line contact pattern DC may include forming a conductive layer filling the bit line contact hole and performing a planarization process. For example, the bit line contact pattern DC may be formed of polysilicon. The second conductive pattern 142, the third conductive pattern 143, and the first to third capping patterns 146, 147 and 148 may be sequentially formed on the first conductive pattern 141, and then, the first to third conductive patterns 141, 142, and 143 may be sequentially etched using the first to third capping patterns 146, 147, and 148 as an etch mask. As a result, the bit line structure BLS including the bit line BL with the first to third conductive patterns 141, 142, and 143, and the bit line capping pattern BC with the first to third capping patterns 146, 147 and 147, may be formed.

The spacer structure SS may be formed on side surfaces of the bit line structure BLS. The spacer structure SS may be formed of a plurality of layers. Fence insulating patterns 154 may be formed between the spacer structures SS. The fence insulating patterns 154 may include, e.g., silicon nitride or silicon oxynitride. An opening exposing the second impurity region 105b may be formed by performing an anisotropic etching process using the fence insulating patterns 154 and the third capping pattern 148 as an etch mask.

The lower conductive pattern 150 may be formed below the opening. The lower conductive pattern 150 may be formed of a semiconductor material, e.g., polysilicon. For example, the lower conductive pattern 150 may be formed by forming a polysilicon layer filling the opening and then performing an etch-back process.

The metal-semiconductor compound layer 155 may be formed on the lower conductive pattern 150. The formation of the metal-semiconductor compound layer 155 may include a metal layer deposition process and a heat treatment process.

The upper conductive pattern 160 may be formed on an upper portion of the first opening. Forming the upper conductive pattern 160 may include sequentially forming the barrier layer 162 and the conductive layer 164. Thereafter, a patterning process may be performed on the barrier layer 162 and the conductive layer 164 to form insulating patterns 165 passing therethrough. Accordingly, a lower structure including the substrate 101, the word line structure WLS, and the bit line structure BLS may be formed.

Referring to FIG. 8, the lower electrodes 170 and the support layer 175 may be formed on the substrate 101 (S10). Forming the lower electrodes 170 and the support layer 175 will be further described with reference to FIGS. 9 to 11 below.

Figure 9:
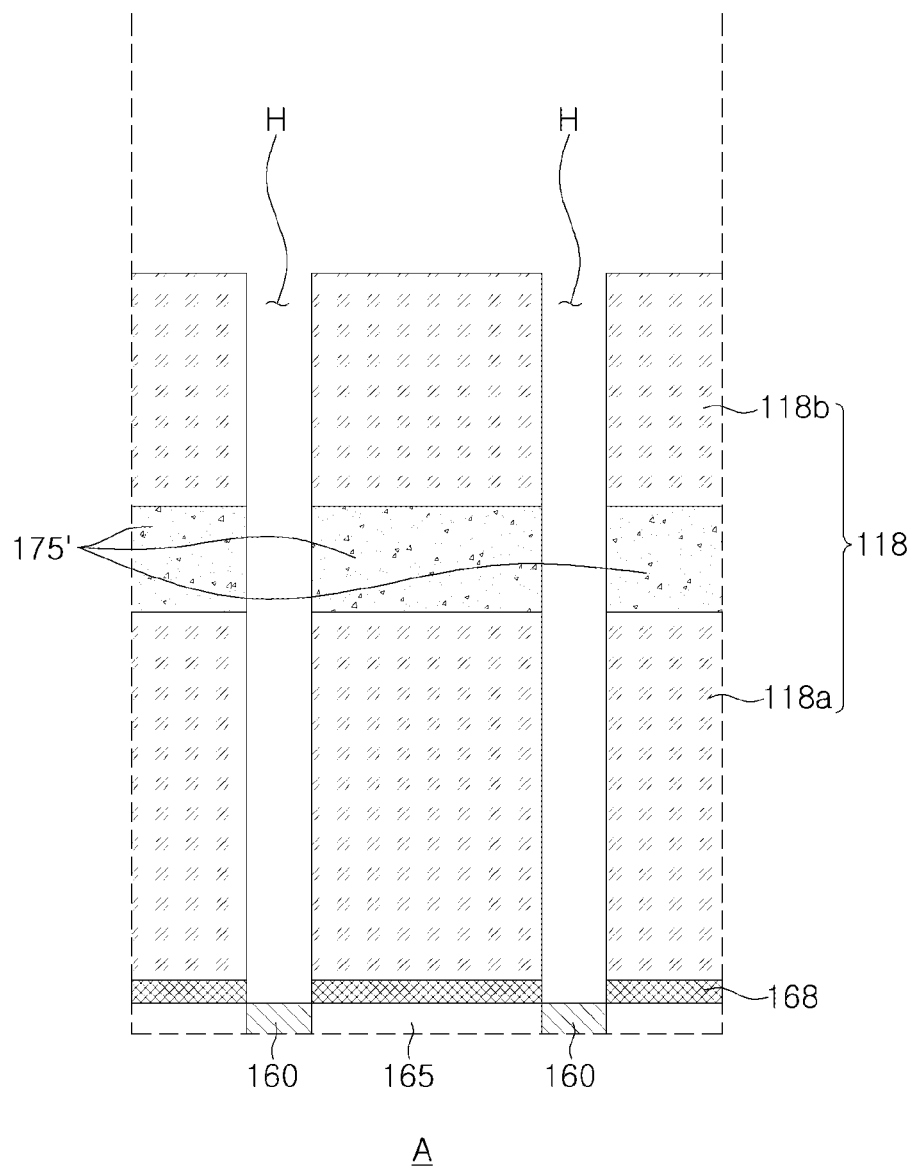
FIGS. 9 to 13 are cross-sectional views of stages in a method of manufacturing a semiconductor device according to example embodiments.

Referring to FIG. 9, the etch stop layer 168 may be conformally formed on the lower structure, and mold layers 118 and at least one support layer 175' may be formed on the etch stop layer 168. The etch stop layer 168 may include an insulating material having etch selectivity with the mold layers 118 under specific etch conditions, e.g., at least one of silicon nitride, silicon oxynitride, silicon carbonitride, and silicon boron nitride. The mold layers 118 may include a first mold layer 118a and a second mold layer 118b on the first mold layer 118a. At least one support layer 175' may be formed between the first mold layer 118a and the second mold layer 118b.

A plurality of holes H passing through the mold layers 118 and the at least one support layer 175' may be formed. In the operation of forming the plurality of holes H, the etch stop layer 168 may serve as a stopper that stops the progress of the etching process. The plurality of holes H may penetrate the etch stop layer 168 to expose the upper conductive patterns 160. The plurality of holes H may be regions in which the lower electrodes 170 are to be formed, and may be formed in a regular arrangement to be spaced apart by a predetermined interval on a plane as illustrated in FIG. 1.

Figure 10:
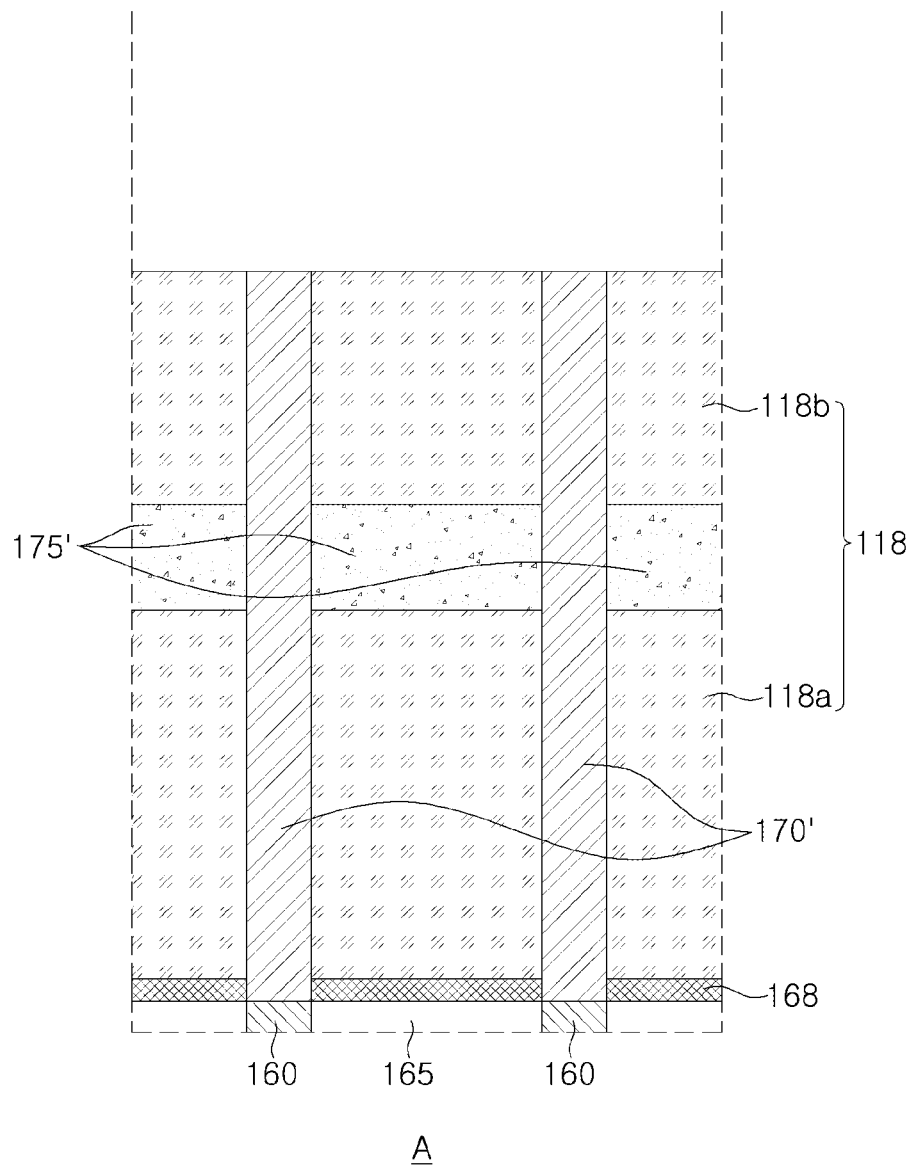

Referring to FIG. 10, the lower electrodes 170' may be formed by filling the plurality of holes H with a conductive material. The lower electrodes 170' may be formed to be connected to the upper conductive pattern 160 at the lower ends of the plurality of holes H. Forming the lower electrodes 170' may include forming a conductive material layer inside the plurality of holes (H) and on the plurality of holes (H), and performing a planarization process, e.g., a chemical mechanical polishing (CMP) process, on the conductive material layer. Therefore, the lower electrodes 170' may be formed in a plurality of patterns spaced apart from each other by node separation.

Figure 11:
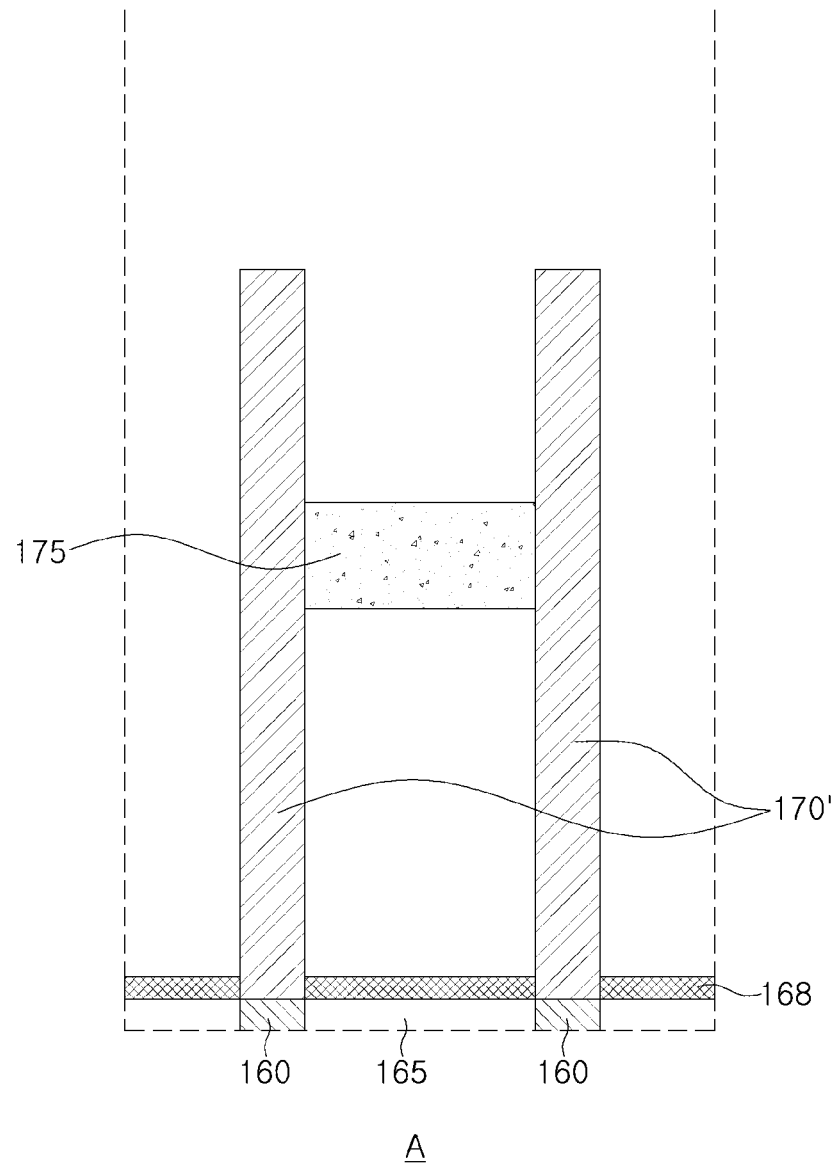

Referring to FIG. 11, a separate mask may be formed on the lower electrodes 170', and at least a portion of the support layer 175' and the mold layers 118 may be removed using the mask. Accordingly, at least one support layer 175 supporting the lower electrodes 170' may be formed. The support layer 175 may be patterned according to the structure of the mask to have a shape including a plurality of openings. The support layer 175 may connect the adjacent lower electrodes 170 to each other. The mold layers 118 may be selectively removed with respect to the support layer 175. The mask may be removed after etching the mold layers 118 or while etching the mold layers 118.

Figure 12:
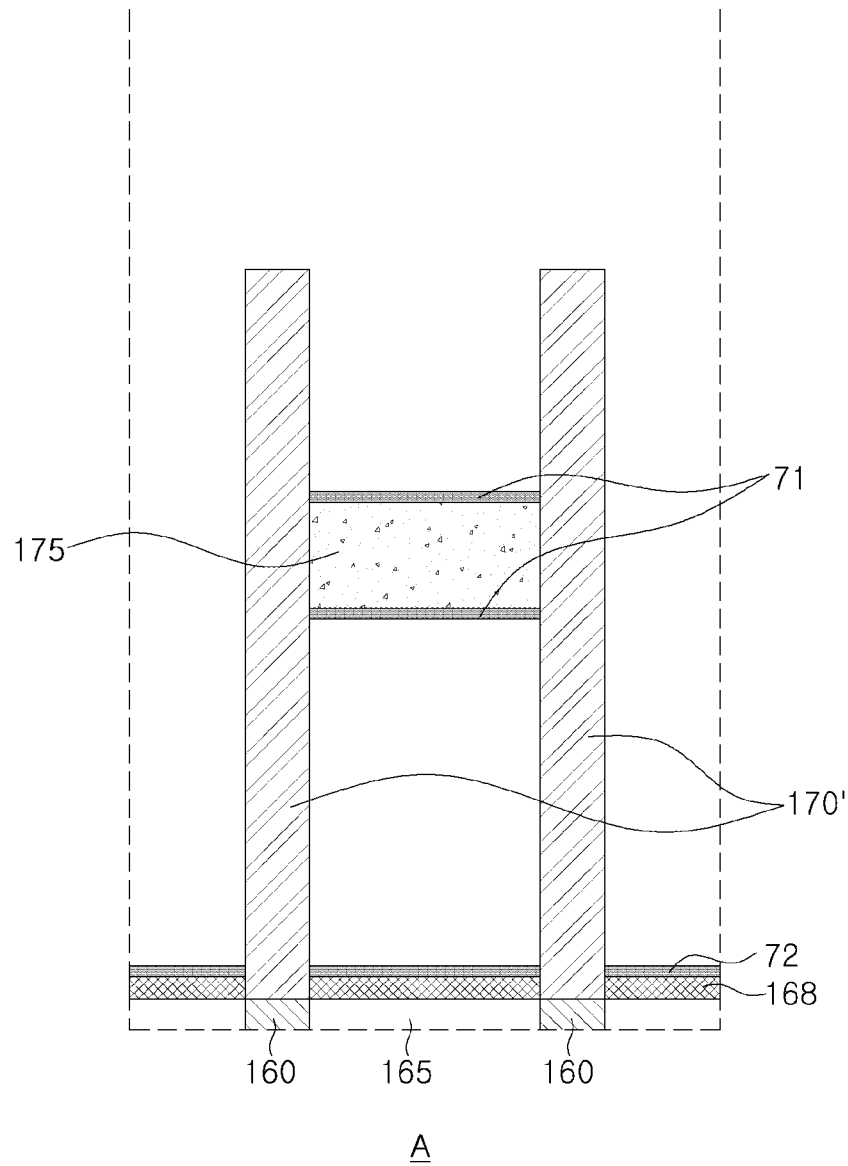

Referring to FIGS. 8 and 12, the first blocking layer 71 may be formed on the support layer 175 using an area selective atomic layer deposition process (S20). The first blocking layer 71 may not be deposited on the lower electrodes 170, but may be selectively deposited only on the surface of the support layer 175. During the area selective atomic layer deposition of the first blocking layer 71, a precursor including a metal compound and a reactive gas, e.g., $H_2O$, $H_2O_2$, $O_2$, $O_3$, $H_2$, $NH_3$, $N_2$, or the like, may be supplied. According to example embodiments, an inhibitor capable of inhibiting deposition on the surfaces of the lower electrodes 170 may be supplied together.

While forming the first blocking layer 71, the second blocking layer 72 may be selectively deposited on the etch stop layer 168, e.g., the first and second blocking layers 71 and 72 may be formed simultaneously by the same deposition process. The second blocking layer 72 may also be selectively deposited on the surface of the etch stop layer 168 without being deposited on the lower electrodes 170 by the same area selective deposition (ASD) method as the first blocking layer 71.

The first blocking layer 71 may be formed to include a portion in which the thickness decreases or increases as it approaches the side surfaces of the lower electrodes 170. The second blocking layer 72 may be formed to include a portion of which a thickness decreases or increases as it approaches the side surfaces of the lower electrodes 170.

Figure 13:
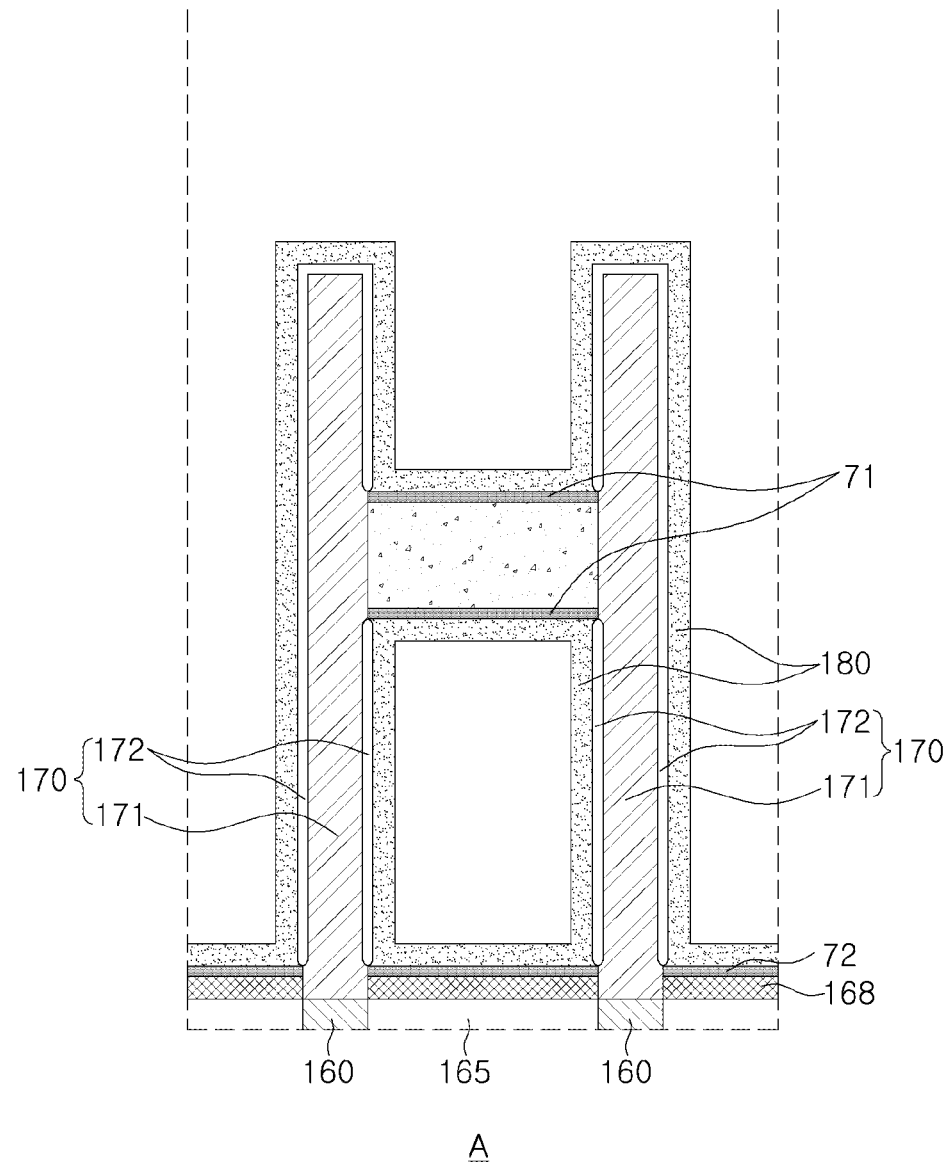

Referring to FIGS. 8 and 13, the dielectric layer 180 may be formed on the lower electrodes 170 and the blocking layers 71 and 72 (S30). The dielectric layer 180 may be formed to cover the surfaces of the lower electrodes 170 and the surfaces of the blocking layers 71 and 72 with a conformal thickness. The lower electrodes 170' may be formed of the lower electrodes 170 including the conductive layer 171 and the interfacial film 172. During or prior to forming the dielectric layer 180, the interfacial film 172 may be formed by partially oxidizing the lower electrode 170' from the surface and/or performing a doping process.

Next, referring to FIG. 3, the upper electrode 190 may be formed on the dielectric layer 180 (S40). Accordingly, the capacitor structure CAP including the lower electrodes 170, the dielectric layer 180, the upper electrode 190, and the blocking layers 71 and 72 may be formed on the lower structure, and the semiconductor device 100 including the same may be manufactured.

By way of summation and review, example embodiments provide a semiconductor device having improved electrical characteristics and reliability. That is, as set forth above, by disposing a blocking layer to extend lengthwise along the surface of the etch stop layer and/or the surface of the support layer in contact with the lower electrodes of the capacitor structure, a semiconductor device having improved electrical characteristics and reliability may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
a plurality of lower electrodes on the substrate;
at least one support layer in contact with the plurality of lower electrodes, the at least one support layer extending in a direction parallel to an upper surface of the substrate;
an upper electrode on the plurality of lower electrodes and the at least one support layer;
a dielectric layer between the plurality of lower electrodes and the upper electrode, and between the at least one support layer and the upper electrode; and
a blocking layer between the at least one support layer and the dielectric layer, the blocking layer including a material having a bandgap energy greater than a bandgap energy of a material of the at least one support layer, and
wherein the dielectric layer is in contact with the plurality of lower electrodes and is spaced apart from the at least one support layer by the blocking layer, and
wherein the blocking layer has a thickness less than a thickness of the dielectric layer.

2. The semiconductor device as claimed in claim 1, wherein the blocking layer extends along a surface of the at least one support layer.

3. The semiconductor device as claimed in claim 1, wherein:
the blocking layer includes aluminum oxide, zirconium oxide, lanthanum oxide, hafnium oxide, yttrium oxide, beryllium oxide, magnesium oxide, silicon oxide, hafnium silicon oxide, zirconium silicon oxide, or combinations thereof, and
the at least one support layer includes silicon nitride, silicon oxynitride, silicon carbonitride, or silicon boron nitride.

4. The semiconductor device as claimed in claim 1, wherein the blocking layer includes a material having a bandgap energy of about 5.0 eV or greater.

5. The semiconductor device as claimed in claim 1, wherein the blocking layer includes a material having a bandgap energy of about 7.0 eV or greater.

6. The semiconductor device as claimed in claim 1, wherein the blocking layer includes a portion of which a thickness decreases, the portion being adjacent to side surfaces of the plurality of lower electrodes.

7. The semiconductor device as claimed in claim 1, wherein the blocking layer includes a portion of which a thickness increases, the portion being adjacent to side surfaces of the plurality of lower electrodes.

8. The semiconductor device as claimed in claim 1, wherein:
   each of the plurality of lower electrodes includes a conductive layer and an interfacial film between the conductive layer and the dielectric layer, and
   the interfacial film extends vertically along a side surface of the conductive layer from a region adjacent to an edge of the blocking layer.

9. The semiconductor device as claimed in claim 8, wherein the interfacial film includes at least one of tin (Sn), molybdenum (Mo), niobium (Nb), tantalum (Ta), titanium (Ti), indium (In), nickel (Ni), cobalt (Co), tungsten (W), ruthenium (Ru), zirconium (Zr), and hafnium (Hf), and at least one of oxygen (O) and nitrogen (N).

10. The semiconductor device as claimed in claim 1, further comprising:
    an active region on the substrate;
    a word line intersecting the active region;
    a bit line on the word line; and
    a contact structure on a side surface of the bit line and electrically connecting a portion of the active region to one of the plurality of lower electrodes.

11. A semiconductor device, comprising:
    a plurality of contact structures on a substrate;
    an etch stop layer on the plurality of contact structures;
    a plurality of lower electrodes passing through the etch stop layer, the plurality of lower electrodes being connected to the plurality of contact structures, respectively;
    at least one support layer in contact with the plurality of lower electrodes and extending in a direction parallel to an upper surface of the substrate;
    an upper electrode on the plurality of lower electrodes and the at least one support layer;
    a dielectric layer between the plurality of lower electrodes and the upper electrode, and between the at least one support layer and the upper electrode;
    a first blocking layer between the at least one support layer and the dielectric layer, the first blocking layer including a material having a bandgap energy greater than a bandgap energy of a material of the at least one support layer; and
    a second blocking layer between the etch stop layer and the dielectric layer, the second blocking layer including a material having a bandgap energy greater than the bandgap energy of the material of the at least one support layer.

12. The semiconductor device as claimed in claim 11, wherein:
    the first blocking layer is in contact with the at least one support layer and extends along a surface of the at least one support layer, and
    the second blocking layer is in contact with the etch stop layer and extends along a surface of the etch stop layer.

13. The semiconductor device as claimed in claim 12, wherein the dielectric layer extends along surfaces of the plurality of lower electrodes, a surface of the first blocking layer, and a surface of the second blocking layer.

14. The semiconductor device as claimed in claim 11, wherein at least one of the first and second blocking layers does not extend between surfaces of the plurality of lower electrodes and the dielectric layer.

15. The semiconductor device as claimed in claim 11, wherein:
    the first blocking layer includes a portion of which a thickness decreases as the first blocking layer approaches side surfaces of the plurality of lower electrodes, and
    the second blocking layer includes a portion of which a thickness decreases as the second blocking layer approaches the side surfaces of the plurality of lower electrodes.

16. The semiconductor device as claimed in claim 11, wherein each of the first blocking layer and the second blocking layer includes a material having a bandgap energy of about 7.0 eV or greater.

17. A semiconductor device, comprising:
    a substrate;
    a plurality of lower electrodes on the substrate, each of the plurality of lower electrodes including a conductive layer and an interfacial film extending along at least one surface of the conductive layer;
    at least one support layer in contact with a side surface of the conductive layer, the at least one support layer extending in a direction parallel to an upper surface of the substrate;
    an upper electrode on the plurality of lower electrodes and the at least one support layer;
    a dielectric layer in contact with the interfacial film, the dielectric layer being between the interfacial film and the upper electrode and between the at least one support layer and the upper electrode; and
    a blocking layer between the at least one support layer and the dielectric layer and in contact with the at least one support layer and the dielectric layer, the blocking layer including a material having a bandgap energy greater than a bandgap energy of a material of the at least one support layer,
    wherein the blocking layer has a thickness less than a thickness of the dielectric layer.

18. The semiconductor device as claimed in claim 17, wherein:
    the blocking layer includes a first portion extending along a lower surface of the at least one support layer and a second portion extending along an upper surface of the at least one support layer, and
    the dielectric layer includes a first portion extending along a lower surface of the first portion of the blocking layer and a second portion extending along an upper surface of the second portion of the blocking layer.

19. The semiconductor device as claimed in claim 17, wherein:
    the at least one support layer includes a first support layer and a second support layer on the first support layer, the first blocking layer being between the first support layer and the dielectric layer, and
    the semiconductor device further includes a second blocking layer between the second support layer and the dielectric layer, the second blocking layer including a material having a bandgap energy greater than the bandgap energy of the material of the first support layer.

\* \* \* \* \*